(12) United States Patent
Moriyama

(10) Patent No.: US 6,525,367 B1
(45) Date of Patent: Feb. 25, 2003

(54) ELECTRODE PROTECTIVE FILM FOR HIGH MELTING POINT SILICIDE OR METAL GATE ELECTRODES

(75) Inventor: Wakako Moriyama, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/666,134

(22) Filed: Sep. 20, 2000

(30) Foreign Application Priority Data

Sep. 20, 1999 (JP) .......................................... 11-266152

(51) Int. Cl.$^7$ ......................................... H01L 21/8247
(52) U.S. Cl. ..................... 257/314; 257/315; 257/316; 257/317
(58) Field of Search ................... 257/314–317, 257/319, 321, 324, 410–413

(56) References Cited

U.S. PATENT DOCUMENTS 5,894,146 A * 4/1999 Pio et al. .................... 257/319
6,040,216 A * 3/2000 Sung .......................... 438/257
6,288,419 B1 * 9/2001 Prall et al. .................. 257/213

FOREIGN PATENT DOCUMENTS

JP          8-64702         3/1996

OTHER PUBLICATIONS

Stanley Wolf, Ph.D., Silicon Processing for the VLSI Era, vol. II: Process Integration, (1990), Lattice Press, pp. 634–635.*

* cited by examiner

Primary Examiner—Minh Loan Tran
(74) Attorney, Agent, or Firm—Oblon, Spivak, McClelland, Maier & Neustadt, P.C.

(57) ABSTRACT

This invention relates to a semiconductor device and its manufacturing method, and more particularly, to a semiconductor devices such as a nonvolatile memory or MOS transistor in which its tunneling oxide film in an oxy-nitride film and at least a part of its control gate is a silicide film or a metal film with a high melting point, and its manufacturing method, which are applicable to NAND EEPROM (electrically erasable and programmable ready-only memory), for example.

In a semiconductor device and its manufacturing method, an electrode protective film, which covers side surfaces of a high-melting-point silicide film or a high-melting-point metal film forming a part of gate electrodes, is made prior to deposition of a secondary oxide film.

15 Claims, 18 Drawing Sheets

12 DIFFUSION LAYER

12 DIFFUSION LAYER

12 DIFFUSION LAYER

ELECTRODE PROTECTIVE FILM FOR HIGH MELTING POINT SILICIDE OR METAL GATE ELECTRODES

CROSS REFERENCE TO RELATED APPLICATIONS

The subject application is related to subject matter disclosed in Japanese Patent Application No. H11-266152 filed on Sep. 20, 1999 in Japan to which the subject application claims priority under Paris Convention and which is incorporated herein by reference.

BACKGROUND OF THE INVENTION

1. Field of the Invention

This invention relates to a semiconductor device and its manufacturing method, and more particularly, to a semiconductor devices such as nonvolatile memory or MOS transistor in which its tunneling oxide film is an oxy-nitride film and at least a part of its control gate is a silicide film or a metal film with a high melting point, and its manufacturing method, which are applicable to NAND EEPROM (electrically erasable and programmable read-only memory), for example.

2. Related Background Art

FIG. 1 is a plan view that shows general configuration of a cell array in a NAND flash memory, and FIG. 2 is a circuit diagram of the cell array of the NAND flash memory shown in FIG. 1.

The cell array of the NAND flash memory shown in FIGS. 1 and 2 is composed of cell transistors CT1, CT2, ..., CTn in which a plurality of n-channel MOS transistors each having a floating gate and a control gate are connected in series; a selection transistor ST1 in form of an n-channel MOS transistor connected between the drain at one end of the serially connected cell transistors CT1, CT2, ..., CTn and a bit line BL; a selection transistor ST2 in form of an n-channel MOS transistor connected between the source at the other end of the serially connected cell transistors CT1, CT2, ..., CTn and a source line GND; selection lines SL1 and SL2 connected to control gates SG1 and SG2 of the selection transistors ST1 and ST2, respectively; and word lines WL1, WL2, ..., WLn connected to control gates CG1, CG2, ..., CGn of the cell transistors CT1, CT2, ..., CTn. The transistors are made in a common well of a common substrate, and the selection line SL1, word lines WL1, WL2, ..., WLn and selection line SL2 are arranged in sequence substantially in parallel in the direction of rows. The other ends of the word lines WL1, WL2, ..., WLn are connected to a connection pad for connection to a peripheral circuit via aluminum wirings.

Explained below is a structure of a cell array of a conventional NAND flash memory and its manufacturing method with reference to a cross-sectional view of a portion corresponding to the B–B' line of FIG. 1.

FIG. 3 is the cross-sectional view that shows the structure of the cell array in the conventional NAND flash memory.

The cell array of the conventional NAND flash memory shown in FIG. 3 is composed of a silicon substrate 1; a first gate insulating film 3 in form of an oxy-nitride film stacked on the top surface of the silicon substrate 1; floating gates 4 in form of a polycrystalline silicon film stacked on predetermined locations of the first gate insulating film 3; a second gate insulating film 5 in form of a silicon oxide film stacked on the floating gates 4; control gates made of a polycrystalline silicon film 6 and a tungsten silicide film 7 sequentially stacked on the second gate insulating film 5; an oxide film 8 stacked on the tungsten silicide film 7; a secondary oxide film 11 in form of a silicon oxide film stacked on side surfaces of the oxide film 8, the tungsten silicide film 7, and the polycrystalline silicon film 6, the second gate insulating film 5, the polycrystalline silicon film 4 and top surface of the oxide film 8; and diffusion layers 12 formed in predetermined regions of the top surface portion of the silicon substrate 1.

The cell array of the above conventional NAND flash memory is made by the following manufacturing method.

FIGS. 4A through 4G are cross-sectional views of the cell array of the conventional NAND flash memory shown in FIG. 3 under a process of its manufacturing method.

First as shown in FIG. 4A, the silicon oxide film 2, 7 nm thick, is made on the silicon substrate 1 by thermal oxidation.

After the silicon oxide film 2 is formed, as shown in FIG. 4B, the silicon oxide film 2 is nitrified by using ammonium gas ($NH_3$) and next oxidized to form an oxy-nitride film 3. This oxy-nitride film 3 serves as a first gate oxide film, and it is normally called a tunneling oxide film.

After the oxy-nitride film 3 is made, as shown in FIG. 4C, the polycrystalline silicon film 4, 200 nm thick and doped with phosphorus as an impurity, is formed on the oxy-nitride film 3 by LPCVD. The polycrystalline silicon film 4 is later processed to a first gate electrode, and it is normally called a floating gate. After the polycrystalline silicon film 4 is made, the second gate insulating film 5, 120 nm thick, is stacked on the polycrystalline silicon film 4 by LPCVD. After the second gate insulating film 5 is formed, the polycrystalline silicon film 6 doped with phosphorus as an impurity is stacked on the second gate insulating film 5 by LPCVD, and the tungsten silicide film 7, which is a low-resistance wiring material, is further stacked on the polycrystalline silicon film 6 by CVD. The polycrystalline silicon film 6 and the tungsten silicide film 7, altogether, form the second gate electrode which is normally called a control gate. After the tungsten silicide film 7 is formed, the oxide film 8 is made on the tungsten silicide film 7.

After the oxide film 8 is made, as shown in FIG. 4D, a photo resist 9 is spread on the oxide film 8 and processed into a predetermined pattern by photo-etching. Then, using the photo resist 9 as a mask, the oxide film 8 is processed into the same pattern by RIE or other dry etching. After the oxide film 8 is formed, the photo resist 9 is removed.

After removal of the photo resist 9, as shown in FIG. 4E, using the oxide film 8 as a mask, the tungsten silicide film 7, the polycrystalline silicon film 6, the second gate insulating film 5 and the polycrystalline silicon film 4 are selectively removed sequentially in the vertical direction by anisotropic etching using RIE or other dry etching technique.

After that, for the purpose of preventing leak current at the gate end, improving surface resistance to voltage of the peripheral circuit MOS transistor, i.e. resistance to voltage of the gate insulating film and recovering damages introduced into the gate oxide film through the gate electrode by RIE, and for other purposes, the silicon oxide film 11 is stacked on side surfaces of the oxide film 8, the tungsten silicide film 7, the polycrystalline silicon film 6, the second gate insulting film 5 and the polycrystalline silicon film 4 and the top surface of the oxide film 8 as shown in FIG. 4F. Normally, this oxidation process is called secondary oxidation process, and the oxide film 11 made in this step is called secondary oxide film.

After the secondary oxide film 11 is made, as shown in FIG. 4G, for the purpose of making source regions and drain regions, an impurity is ion-implanted into the silicon substrate 1 and activated by annealing to create diffusion layers 12 and make memory transistors. As a result, the structure of the cell array of the conventional NAND flash memory shown in FIG. 3 is obtained.

However, in the case where an oxy-nitride film is used as the tunneling oxide film 3 like the cell array of the conventional NAND flash memory as discussed above, nitrogen concentration of the tunneling oxide film 3 is high, and especially after RIE for gate processing, nitrogen concentration of the tunneling oxide film 3 becomes high along the circumferential portion of the bottom of the floating gate 4. As a result, as shown in FIGS. 4F and 4G, it becomes difficult to make the secondary oxide film 11 along the circumference portion of the bottom of the floating gate 4, and it invites deterioration of the device property, decrease of the reliability, drop of the production yield, an so on.

On the other hand, if the secondary oxide film 11 is made by wet oxidation exhibiting a high oxidizing function, then the deposition of the secondary oxide film 11 is promoted, but its oxidizing function causes abnormal growth of the tungsten silicide film 7 of the control gate, which in turn damages the second gate insulating film 5 and the first gate oxide film (tunneling oxide film) 3.

SUMMARY OF THE INVENTION

It is therefore an object of the invention to provide a semiconductor device and its manufacturing method in which a secondary oxide film can be normally made along the circumferential portion of the bottom of a gate electrode in a semiconductor device using an oxy-nitride film as a tunneling oxide film and a silicide film with a high melting point or a metal film with a high melting point to form at least a part of the gate electrode while preventing abnormal growth of the high-melting-point silicide film or the high-melting-point metal film.

A semiconductor device according to the first configuration of the invention comprises a semiconductor substrate; a gate insulating film in form of an oxy-nitride film formed on a surface of the semiconductor substrate; a gate electrode formed on a predetermined region of the gate insulating film and partly made of a silicide film having a high melting point or a metal film having a high melting point; an electrode protective film formed to cover side surfaces of the gate electrode and lie apart from the gate insulating film; and a secondary oxide film formed on surfaces of the gate insulating film, the gate electrode and the electrode protective film.

A semiconductor device according to the second configuration of the invention comprises a semiconductor substrate; a first gate insulating film in form of an oxy-nitride film formed on a surface of the semiconductor substrate; a first gate electrode formed on a predetermined region of the first gate insulating film; a second gate insulating film formed on the first gate electrode; a second gate electrode formed on the second gate insulating film and partly made of a silicide film having a high melting point or a metal film having a high melting point; an electrode protective film formed to cover side surfaces of the second gate electrode and lie apart from the first gate insulating film; and a secondary oxide film formed on surfaces of the first gate insulating film, the first gate electrode, the second gate insulating film and the second gate electrode.

A manufacturing method of a semiconductor device according to the first configuration of the invention comprises a first step of making a gate insulating film in form of an oxy-nitride film on a surface of a semiconductor substrate; a second step of making a semiconductor layer as a part of a gate electrode on the gate insulating film; a third step of making a silicide film having a high melting point or a metal film having a high melting point as a part of the gate electrode on the semiconductor layer; a fourth step of making a mask member of a pattern of the gate electrode on the silicide film having a high melting point or the metal film having a high melting point; a fifth step of etching the silicide film having a high melting point or the metal film having a high melting point into the pattern of the gate electrode by using the mask member as a mask while maintaining the surface of the gate insulating film covered; a sixth step of making an electrode protective film which covers side surfaces of the silicide film having a high melting point or the metal film having a high melting point, and lies apart from the gate insulating film, while maintaining the surface of the gate insulating film covered; a seventh step of etching the semiconductor layer into the form of the gate electrode by using the electrode protective film as a mask; and an eighth step of making a secondary oxide film by secondary oxidation of surfaces of the gate insulating film, the gate electrode and the electrode protective film.

A manufacturing method of a semiconductor device according to the second configuration of the invention comprises a first step of making a first gate insulating film in form of an oxy-nitride film on a surface of a semiconductor substrate; a second step of making a first semiconductor layer to be processed as a first gate electrode on the first gate insulating film; a third step of making a second gate insulating film on the first semiconductor layer; a fourth step of making a second semiconductor layer as a part of a second gate electrode on the second gate insulating film; a fifth step of making a silicide film having a high melting point or a metal film having a high melting point as a part of the second gate electrode on the second semiconductor layer; a sixth step of making a mask member of a pattern of the first and second gate electrodes on the silicide film having a high melting point or the metal film having a high melting point; a seventh step of etching the silicide film having a high melting point or the metal film having a high melting point into the form of the second gate electrode by using the mask member as a mask, while maintaining the surface of the first gate insulating film covered; an eighth step of making an electrode protective film which covers side surfaces of the silicide film having a high melting point or the metal film having a high melting point, and lies apart from the first gate insulating film, while maintaining the surface of the first gate insulating film covered; a ninth step of etching the portions of the second semiconductor layer, the second gate insulating film and the first semiconductor layer, which remain as a result of etching in the seventh step, into the form of the first and second gate electrodes by using the electrode protective film as a mask; and a tenth step of making a secondary oxide film by secondary oxidation of surfaces of the gate insulating films, the gate electrodes and the electrode protective film.

In the semiconductor device and its manufacturing method according to each configuration of the invention, since the electrode protective film covering side surfaces of the high-melting-point silicide film or the high-melting-point metal film constructing a part of the gate electrode is made prior to deposition of the secondary oxide film, it is possible to make the secondary oxide film to sufficiently recover the damage of the gate insulating film (the first gate insulating film (the tunneling oxide film)) caused by gate processing while preventing abnormal oxidation of the high-melting-point silicide film or the high-melting-point metal film. At the same time, it is also possible to round gate edges along the circumferential portions of bottoms of the gate electrodes (the first gate electrodes) and thereby prevent concentration of the electric field. Therefore, device property, reliability and production yield can be improved. Additionally, since the electrode protective film covering side surfaces of the high-melting-point silicide film or the high-melting-point metal film is formed to be apart from the gate insulating film (the first gate insulating film (the tunneling oxide film)) and lie only over the gate electrodes (the first gate electrodes), deterioration of the gate insulating film (the first gate insulating film (the tunneling oxide film)) by moisture contained in the electrode protective film does not occur, and the current flowing in the gate insulating film (the first gate insulating film (the tunneling oxide film)) can be stabilized.

DESCRIPTION OF THE PREFERRED EMBODIMENTS

Explained below are semiconductor devices and their manufacturing methods according to the invention with reference to the drawings.

Semiconductor devices and their manufacturing methods according to the invention are characterized in covering side surfaces of a high-melting-point silicide film or a high-melting-point metal film with an electrode protective film in a semiconductor device that uses an oxy-nitride film as a tunneling oxide film to be secondary oxidized and the high-melting-point silicide film or the high-melting-point metal film to form at least a part of a control gate. Therefore, it is possible to make the secondary oxide film to sufficiently recover damage of the gate insulating film caused by gate processing while preventing abnormal oxidation of the high-melting-point silicide film or the high-melting-point metal film. At the same time, it is also possible to round the gate edge along the circumferential portion of the bottom of the floating gate and thereby prevent concentration of the electric field. Therefore, device property, reliability and production yield can be improved. Additionally, since the electrode protective film, which is an oxide film covering side surfaces of the high-melting-point silicide film or the high-melting-point metal film, is formed to be apart from the tunneling oxide film and lie only over the gate, deterioration of the gate tunneling oxide film by moisture contained in the oxide film does not occur, and the current flowing in the tunneling oxide film can be stabilized.

Figure 1:
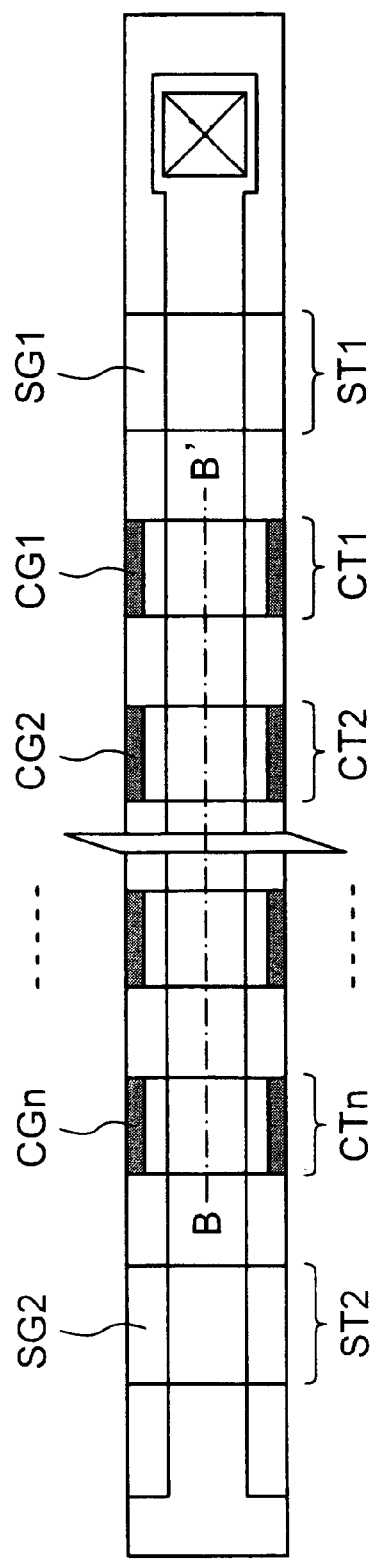
FIG. 1 is a plan view that shows general configuration of a cell array in a NAND flash memory.
Figure 2:
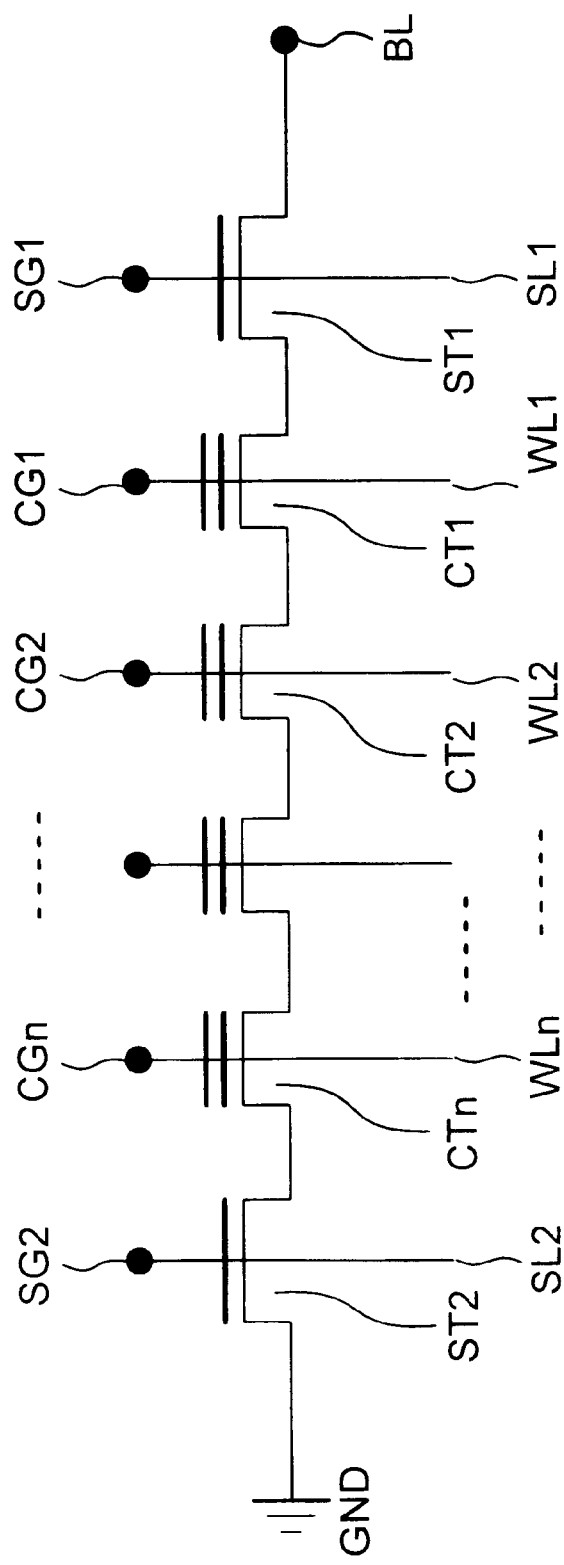
FIG. 2 is a circuit diagram of the cell array of the NAND flash memory shown in FIG. 1.
Figure 3:
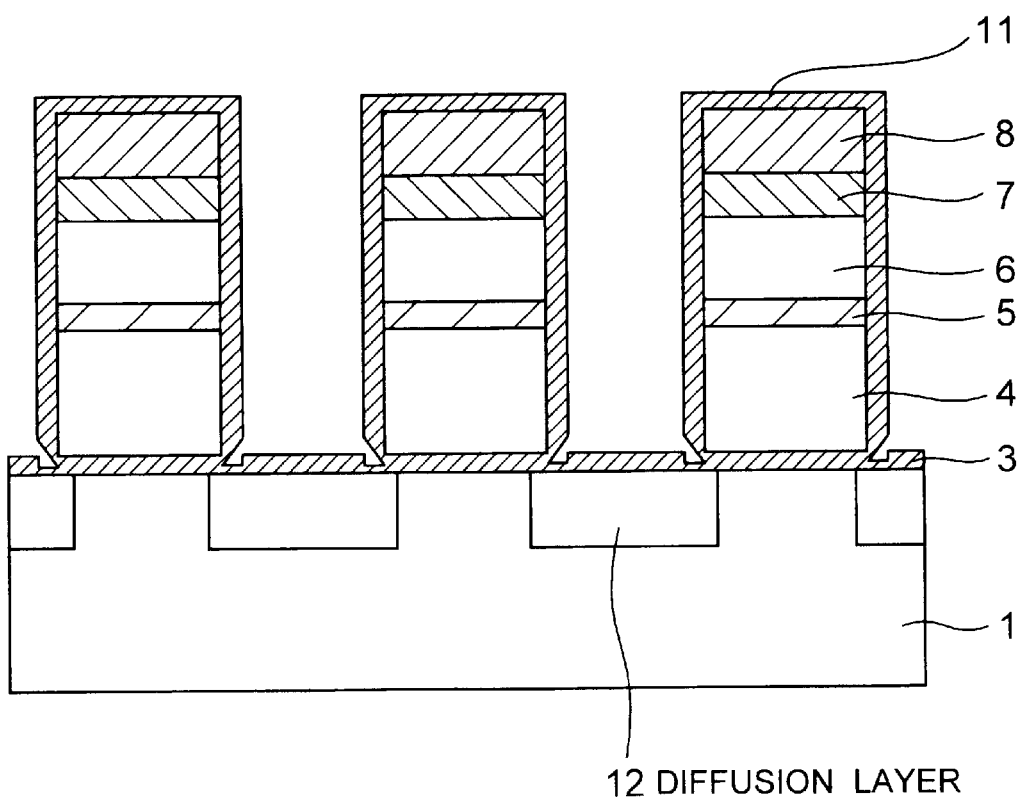
FIG. 3 is a cross-sectional view that shows configuration of the cell array in the conventional NAND flash memory.
Figure 4A:
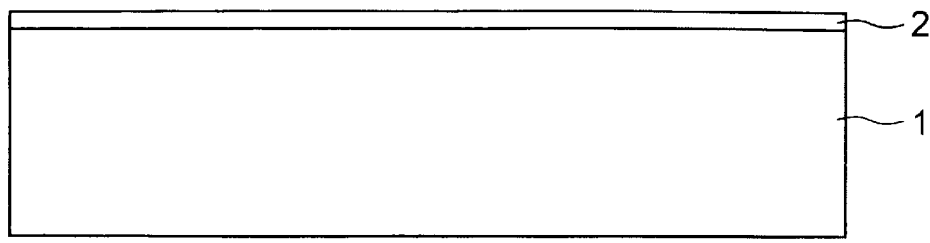
FIGS. 4A through 4G are cross-sectional views of the cell array of the conventional NAND flash memory shown in FIG. 3 under a process of its manufacturing method.
Figure 4B:
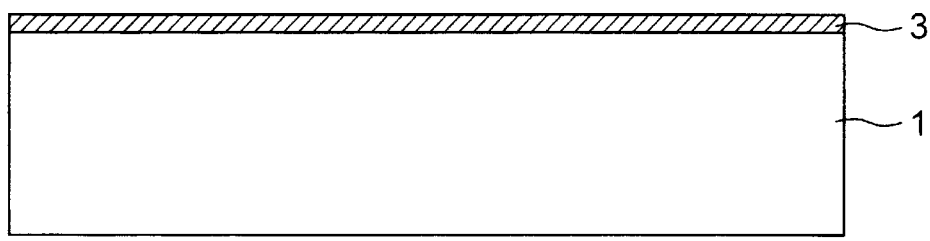
Figure 4C:
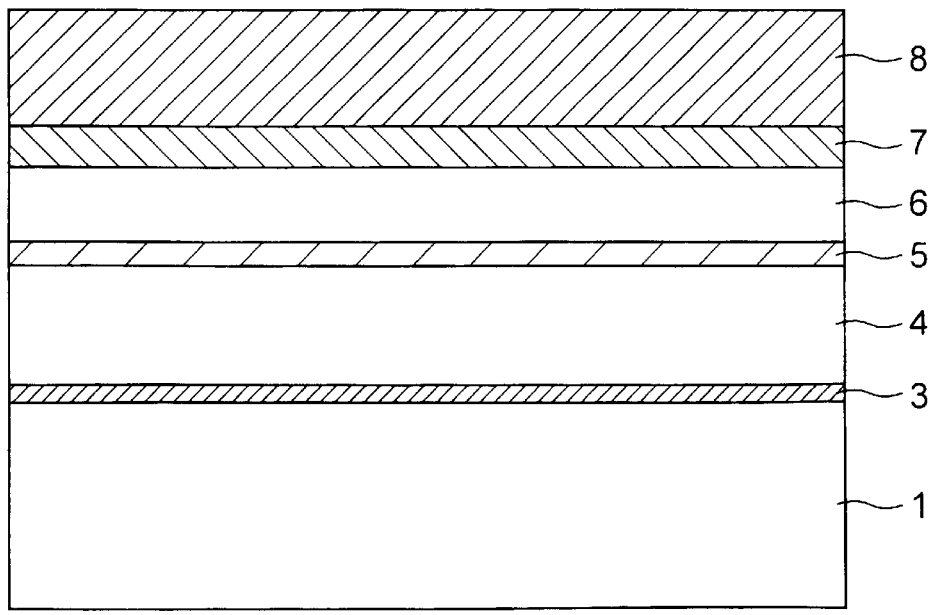
Figure 4D:
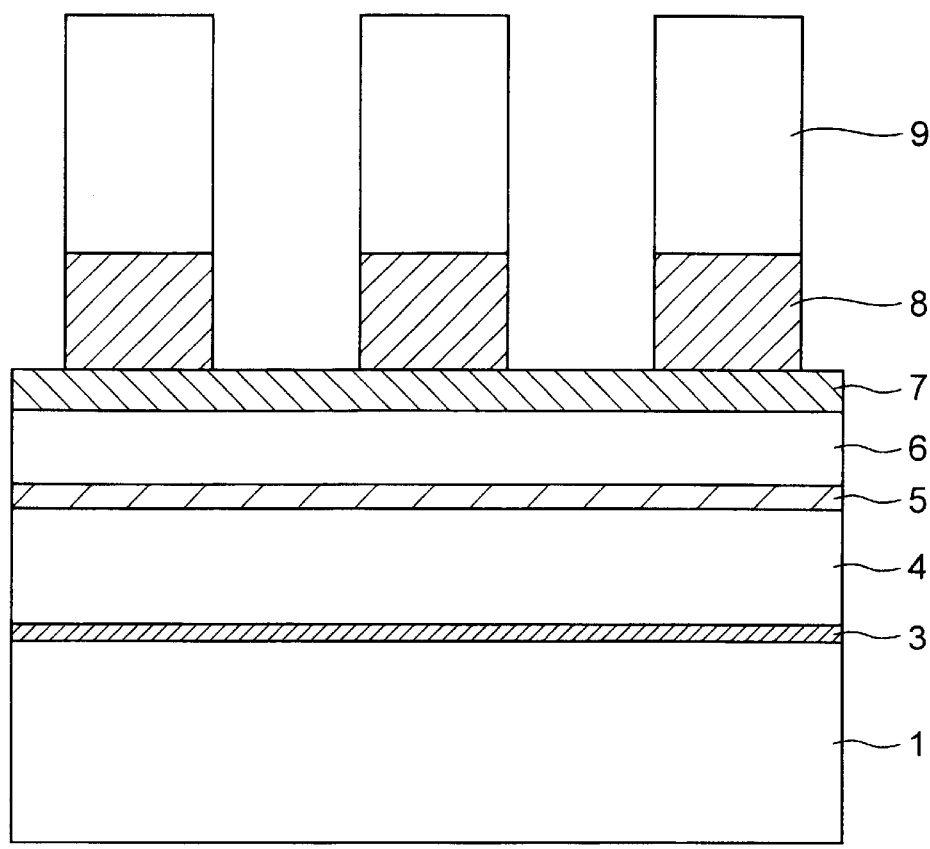
Figure 4E:
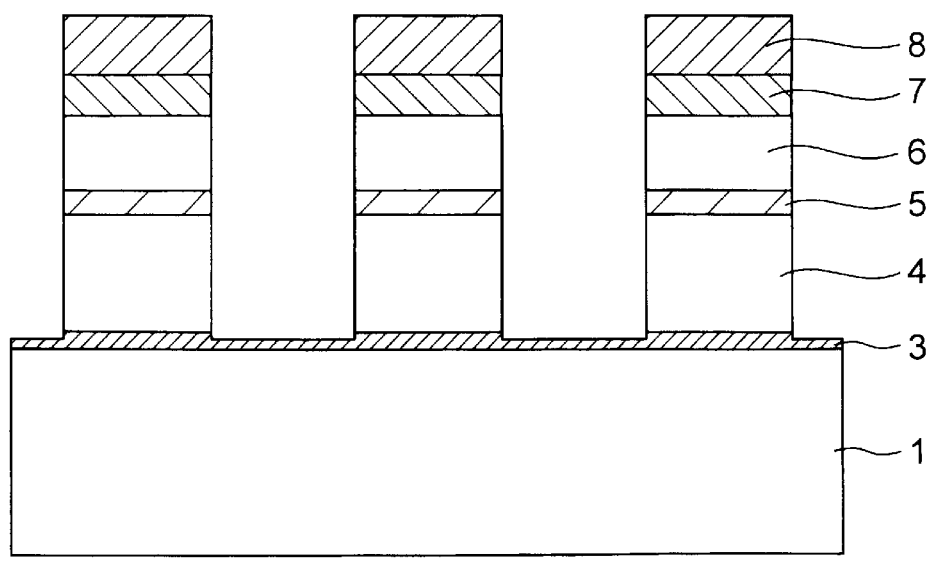
Figure 4F:
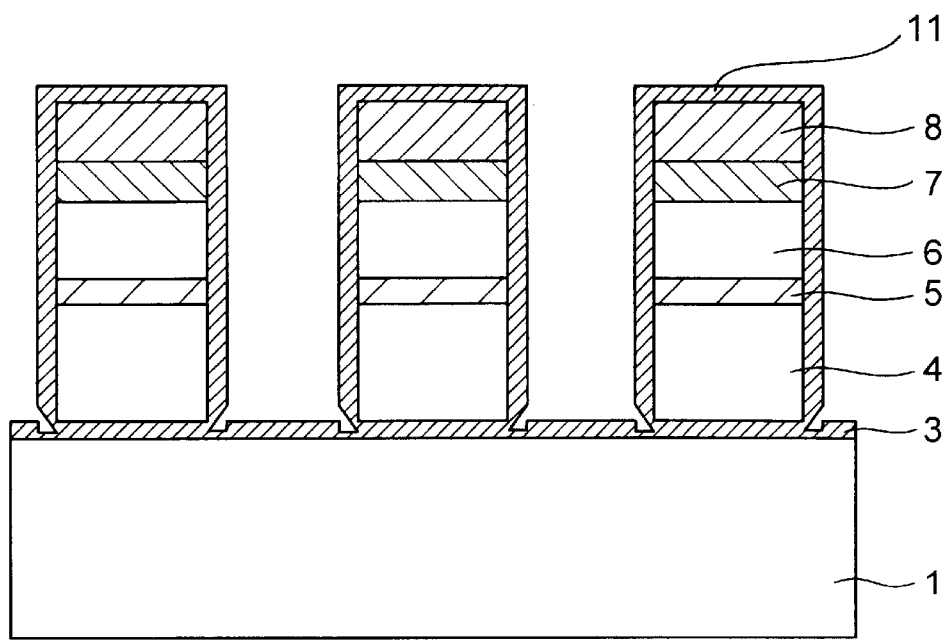
Figure 4G:
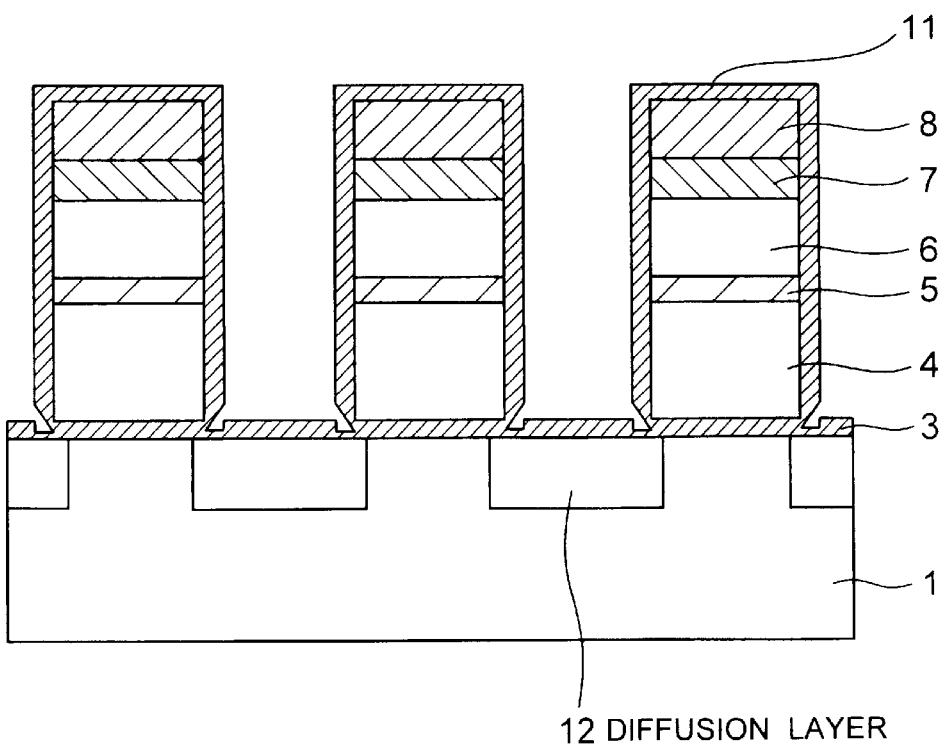
Figure 5:
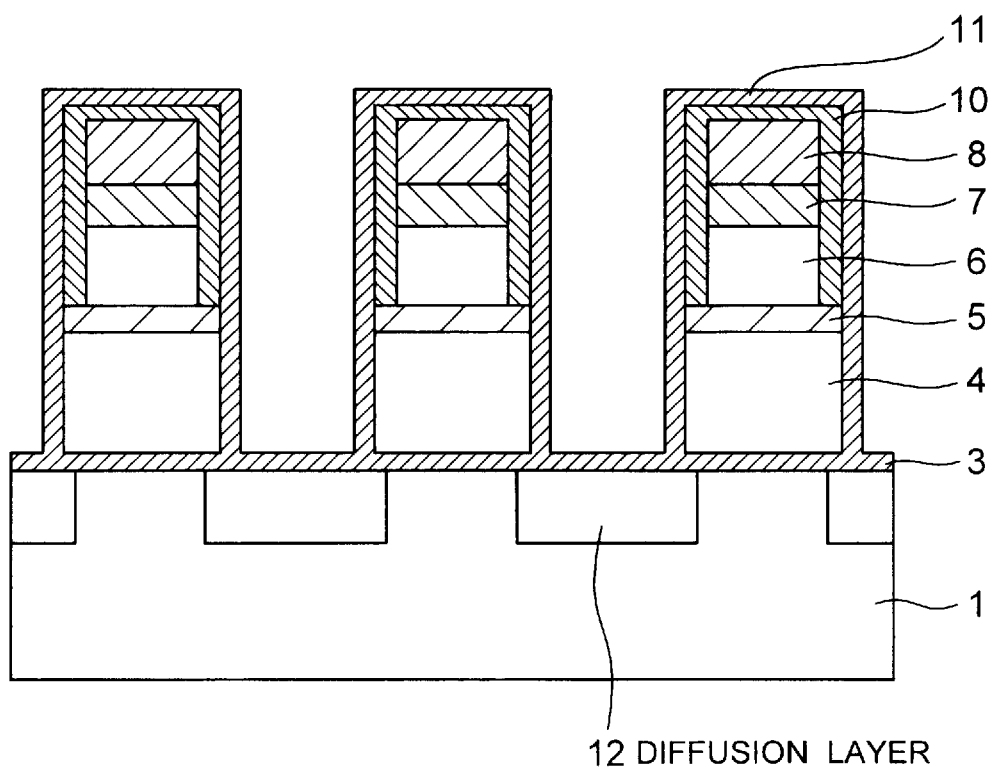
FIG. 5 is a cross-sectional view that shows configuration of a semiconductor device according to the first embodiment of the invention, and it shows a portion corresponding to the B–B' line of FIG. 1. The semiconductor device according to the first embodiment of the invention is a cell array of a NAND flash memory.

FIG. 5 is a cross-sectional view that shows configuration of a semiconductor device according to the first embodiment of the invention, and it shows a portion corresponding to the B–B' line of FIG. 1. The semiconductor device according to the first embodiment of the invention is a cell array of a NAND flush memory.

The cell array of the NAND flash memory according to the first embodiment of the invention shown in FIG. 5 is composed of a silicon substrate 1; a first gate insulating film 3 in form of an oxy-nitride film stacked on the top surface of the silicon substrate 1; floating gates 4 in form of a polycrystalline silicon film stacked on predetermined locations of the first gate insulating film 3; a second gate insulating film 5 in form of a silicon oxide film stacked on the floating gates 4; control gates made of a polycrystalline silicon film 6 and a tungsten silicide film 7 sequentially stacked on the second gate insulating film 5; an oxide film 8 stacked on the tungsten silicide film 7; an electrode protective film 10 which is a silicon oxide film stacked on side surfaces of the oxide film 8, the tungsten silicide film 7 and the polycrystalline silicon film 6, and on the top surface of the oxide film 8; a secondary oxide film 11 which is a silicon oxide film stacked on side surfaces of the electrode protective film 10, the second gate insulating film 5 and the floating gate 4, the top surface of the electrode protective film 10 and the top surface of the first gate insulating film 3; and diffusion layers 12 formed in predetermined regions of the top surface portion of the silicon substrate 1.

The cell array of the NAND flash memory according to the first embodiment of the invention is made by the following manufacturing method according to the first embodiment of the invention.

FIGS. 6A through 6I are cross-sectional views of the cell array of the NAND flash memory according to the first embodiment of the invention under a process of its manufacturing method.

Figure 6A:
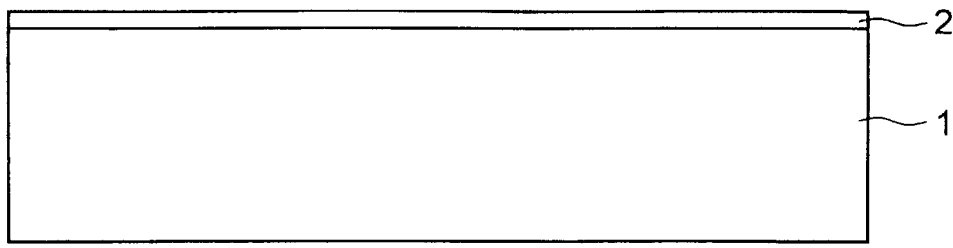
FIGS. 6A through 6I are cross-sectional views that show configuration of the semiconductor device according to the first embodiment of the invention under a process of its manufacturing method.

First as shown in FIG. 6A, the silicon oxide film 2, 7 nm thick, is made on the silicon substrate 1 by thermal oxidation.

Figure 6B:
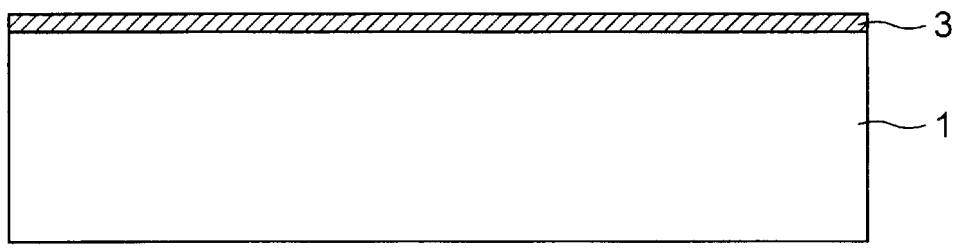

After the silicon oxide film 2 is formed, as shown in FIG. 6B, the silicon oxide film 2 is nitrified by using ammonium gas ($NH_3$) and next oxidized to form an oxy-nitride film 3. This oxy-nitride film 3 serves as a first gate oxide film, and it is normally called a tunneling oxide film.

Figure 6C:
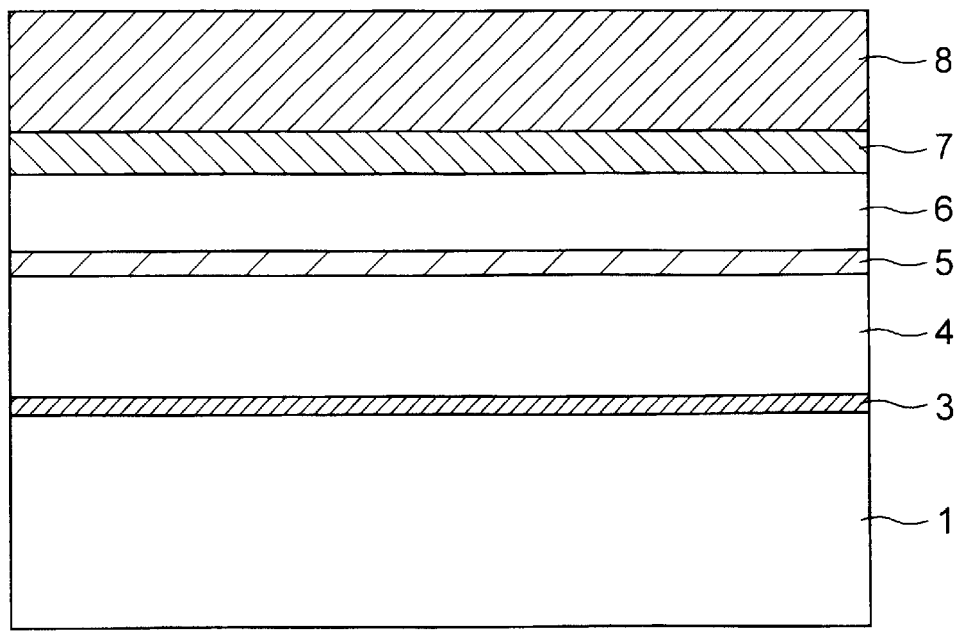

After the oxy-nitride film 3 is made, as shown in FIG. 6C, the polycrystalline silicon film 4, 200 nm thick and doped with phosphorus as an impurity, is formed on the oxy-nitride film 3 by LPCVD. The polycrystalline silicon film 4 is later processed to a first gate electrode, and it is normally called a floating gate. After the polycrystalline silicon film 4 is made, the second gate oxide film 5, which is a 120 nm thick silicon oxide film, is stacked on the polycrystalline silicon film 4 by LPCVD. After the second gate insulating film 5 is formed, the polycrystalline silicon film 6 doped with phosphorus as an impurity is stacked on the second gate insulating film 5 by LPCVD, and the tungsten silicide film 7, which is a low-resistance wiring material, is further stacked on the polycrystalline silicon film 6 by CVD. The polycrystalline silicon film 6 and the tungsten silicide film 7, altogether, form the second gate electrode which is normally called a control gate. After the tungsten silicide film 7 is formed, the oxide film 8 is made on the tungsten silicide film 7 by LPCVD.

Figure 6D:
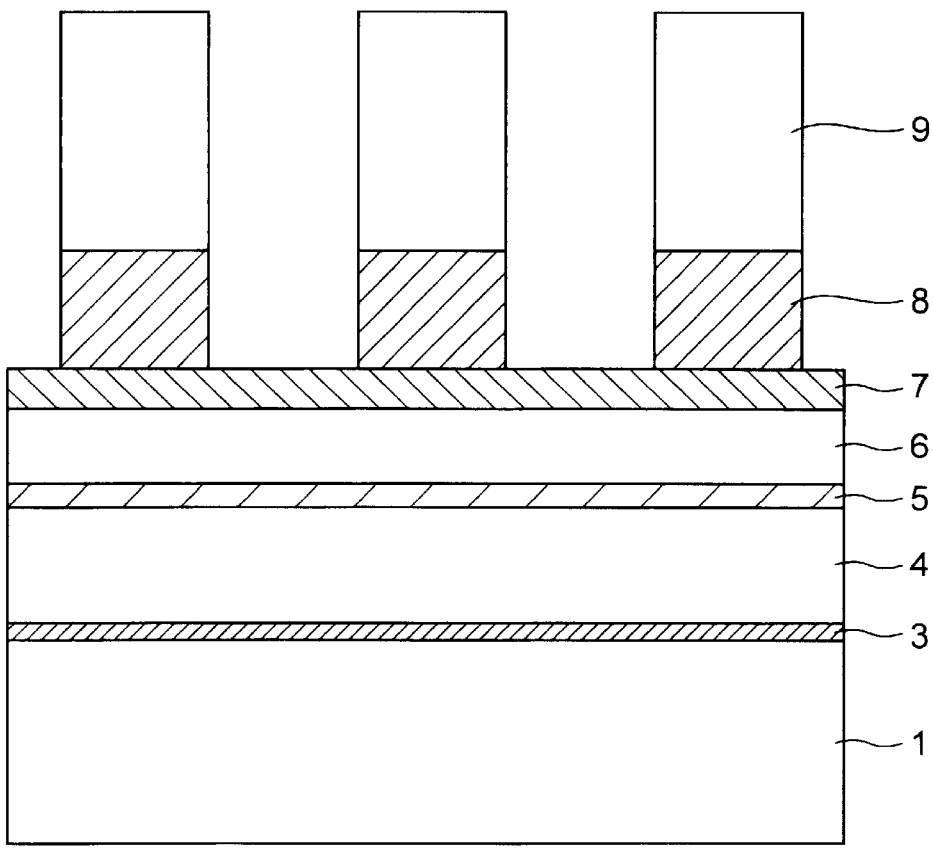

After the oxide film 8 is made, as shown in FIG. 6D, a photo resist 9 is spread on the oxide film 8 and processed into a predetermined pattern by photo-etching. Then, using the photo resist 9 as a mask, the oxide film 8 is processed into the same pattern by RIE or other dry etching. After the oxide film 8 is processed, the photo resist 9 is removed.

Figure 6E:
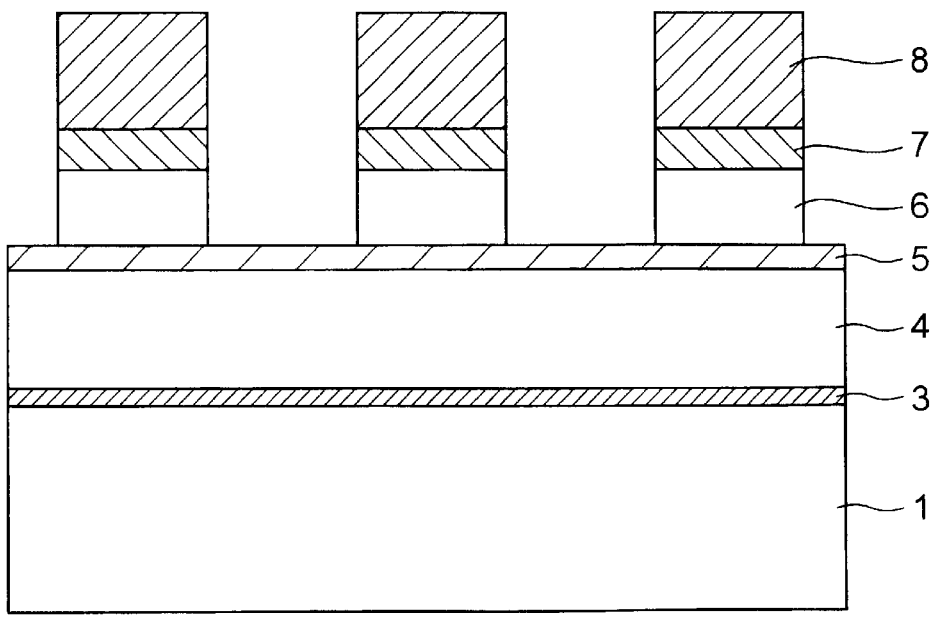

After removal of the photo resist 9, as shown in FIG. 6E, using the oxide film 8 as a mask, the tungsten silicide film 7 and the polycrystalline silicon film 6 are selectively removed sequentially in the vertical direction by anisotropic etching using RIE or other dry etching technique.

Figure 6F:
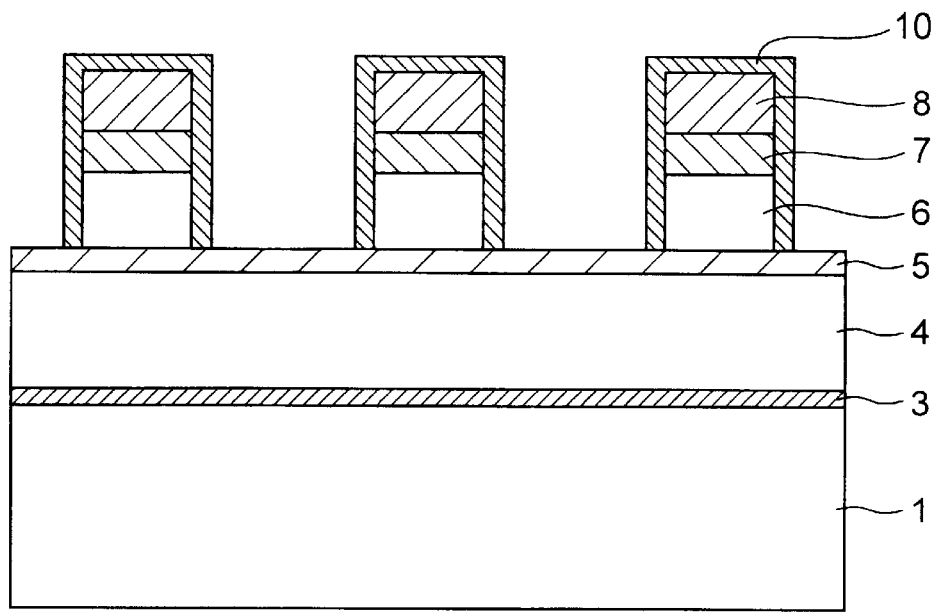

Then, in the semiconductor device and its manufacturing method according to the first embodiment of the invention, after the tungsten silicide film 7 and the polycrystalline silicon film 6 are processed by etching, an oxide film is made as the electrode protective film 10 on side surfaces of the oxide film 8, the tungsten silicide film 7, the polycrystalline silicon film 6 and the top surface of the oxide film 8 by LPCVD as shown in FIG. 6F. Since this electrode protective film 10 is used to prevent abnormal growth of the tungsten silicide film 7 in a later oxidation process, it is sufficient for it to cover side surfaces of the tungsten silicide film 7.

Figure 6G:
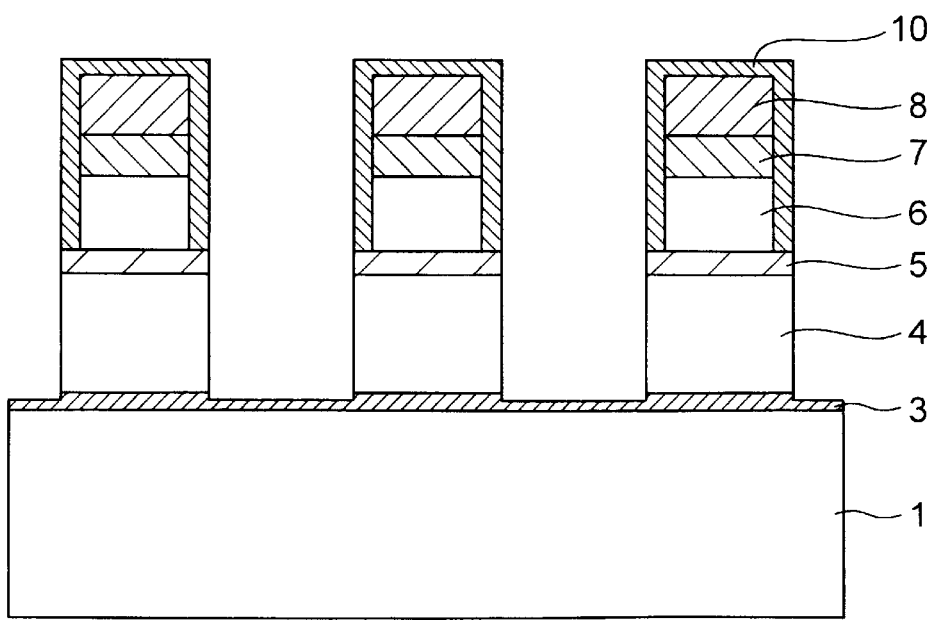

After the electrode protective film 10 is formed, as shown in FIG. 6G, using the electrode protective film 10 as a mask, the second gate insulating film 5 and the polycrystalline silicon film 4 are selectively removed by anisotropic etching sequentially in the vertical direction. As explained above, since the electrode protective film 10 may be formed to cover only side surfaces of the tungsten silicide film 7, a part of the electrode protective film 10 formed on the top surface of the oxide film 8 may be thinned or lost in this etching process.

Figure 6H:
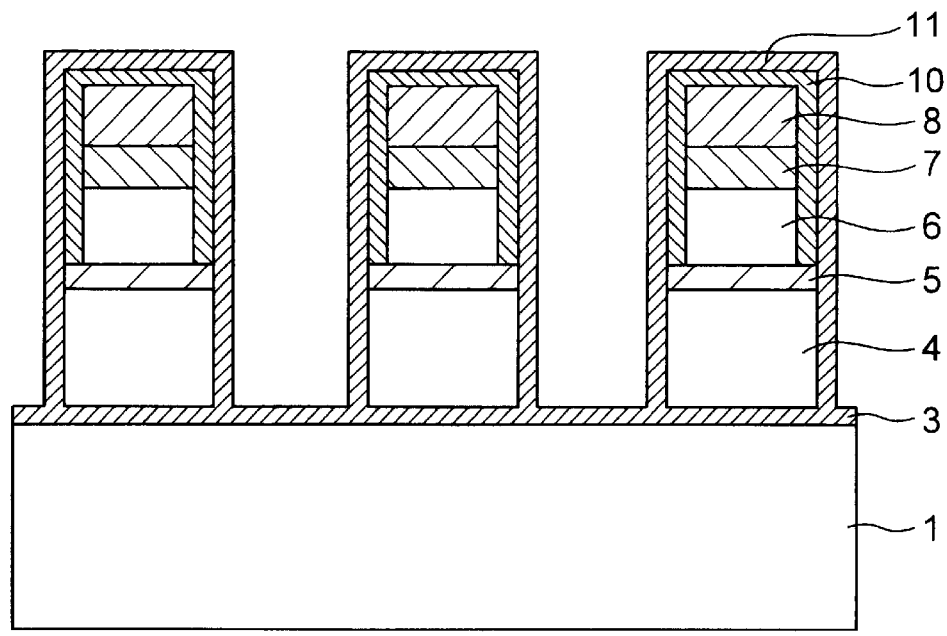

After the second gate insulting film 5 and the polycrystalline silicon film 4 are processed by etching, for the purpose of preventing leak current from the gate end, improving the surface resistance to voltage of the peripheral MOS transistor, i.e., resistance to voltage of the gate insulating film and recovering damages introduced into the gate oxide film through the gate electrode by RIE, and for other purposes, the silicon oxide film 11 is stacked on side surfaces of the electrode protective film 10, the second gate insulting film 5 and the polycrystalline silicon film 4 and the top surface of the electrode protective film 10 by thermal oxidation as shown in FIG. 6H. Normally, this oxidation process is called secondary oxidation process, and the oxide film 11 made in this step is called secondary oxide film. In the semiconductor device and its manufacturing method according to the first embodiment of the invention, since the electrode protective film 10 for preventing abnormal growth of the tungsten silicide film 7 is formed, this secondary oxidation is conducted by wet oxidation to ensure that the first gate insulting film (oxy-nitride film) 3, which is a thermal nitride film, is sufficiently oxidized to form the oxide film 11.

Figure 6I:
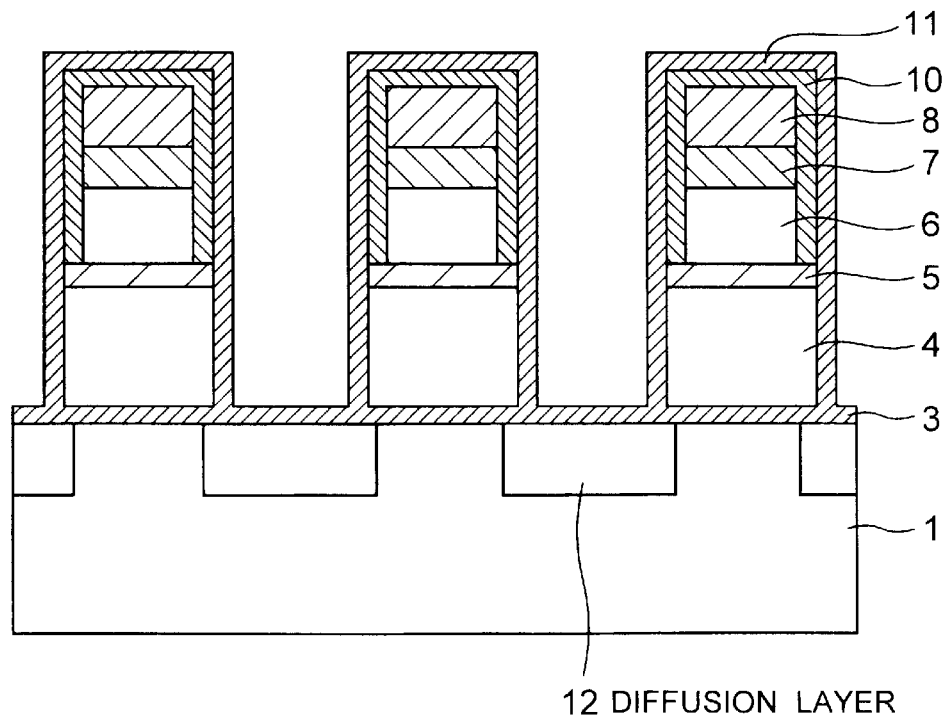

After the secondary oxide film 11 is made, as shown in FIG. 6I, for the purpose of making source regions and drain regions, an impurity is ion-implanted into the silicon substrate 1 and activated by annealing to create diffusion layers 12 and make memory transistors. As a result, the structure of the cell array of the NAND flash memory according to the first embodiment of the invention shown in FIG. 5 is obtained.

In the semiconductor device and its manufacturing method according to the first embodiment of the invention, since the oxide film as the electrode protective film covering side surfaces of the tungsten silicide film 7 forming a part of the control gates is made prior to deposition of the secondary oxide film 11, it is possible to make the secondary oxide film 11 to sufficiently recover the damage of the tunneling oxide film 3 caused by gate processing while preventing abnormal oxidation of the tungsten silicide film 7. At the same time, it is also possible to round gate edges along the circumferential portions of bottoms of the floating gates and thereby prevent concentration of the electric field. Therefore, device property, reliability and production yield can be improved. Additionally, since the oxide film as the electrode protective film 10 covering side surfaces of the tungsten silicide film is formed to be apart from the tunneling oxide film 3 and lie only over the gates, deterioration of the tunneling oxide film 3 by moisture contained in the electrode protective film 10 does not occur, and the current flowing in the tunneling oxide film 3 can be stabilized.

Although this embodiment uses an oxide film made by CVD as the electrode protective film 10, this film may be a nitride film, a polycrystalline film, or the like, instead of the oxide film. Further, this embodiment has been explained as using the tungsten silicide film to form a part of the control gates. However, configuration of the invention is not limited to that, but it is widely applicable to any high-melting point metal films or high-melting point silicide films such as a titanium silicide film, for example. Furthermore, although the foregoing embodiment has been explained as making the oxide film as the electrode protective film 10 covering side surfaces of the tungsten silicide film 7 by LPCVD just after etching the tungsten silicide film 7 and the polycrystalline silicon film, the process need not follow this sequence, but the order of making the oxide film by LPCVD as the electrode protective film 10 may be determined optionally as far as the tungsten silicide film 7 is already etched and the top surface of the tunneling oxide film 3 is not exposed. Moreover, although this embodiment uses wet oxidation to make the oxide film 11, ozone oxidation, for example, may be used instead. Further, the oxide film 8 formed on the control gates may be a nitride film, for example, provided it can functions as a mask during RIE.

Figure 7:
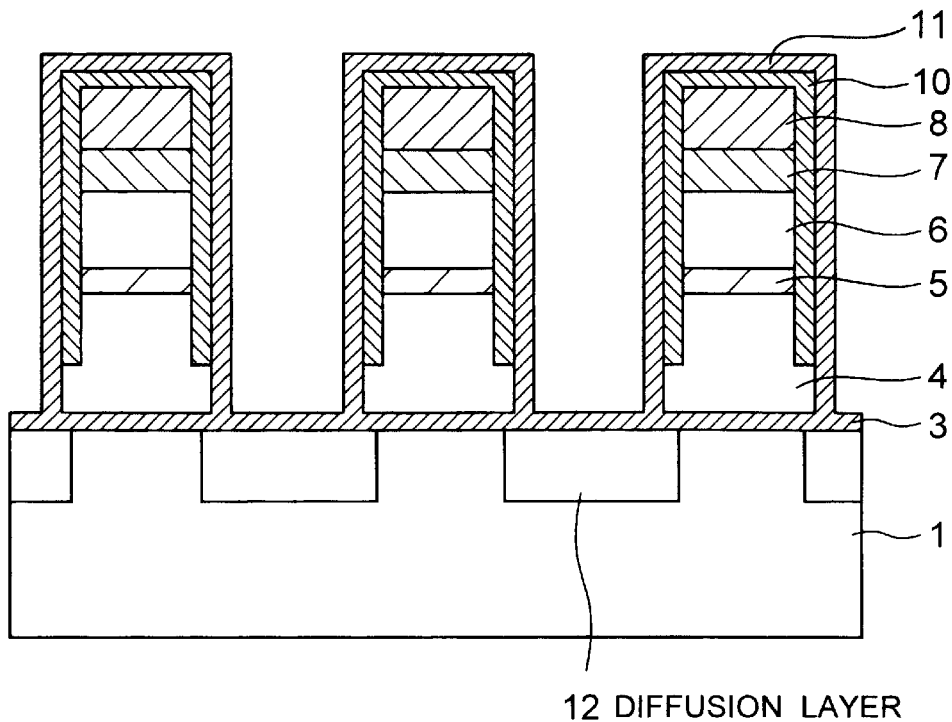
FIG. 7 is a cross-sectional view that shows configuration of the first modification of the semiconductor device according to the first embodiment of the invention.
Figure 8:
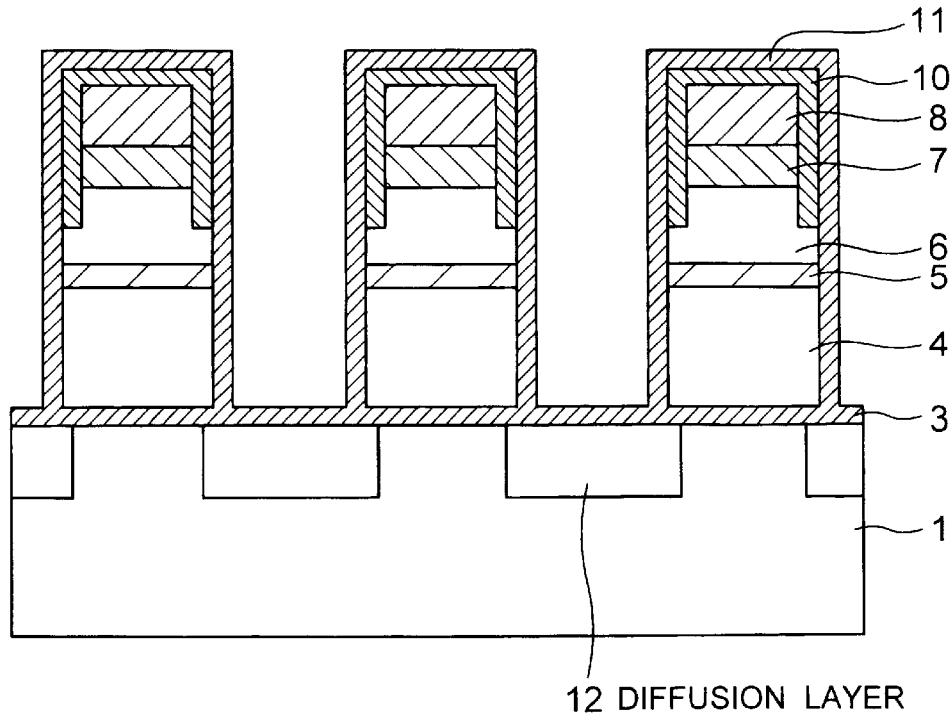
FIG. 8 is a cross-sectional view that shows configuration of the second modification of the semiconductor device according to the first embodiment of the invention.

FIGS. 7 and 8 are cross-sectional views that show configurations of the first and second modifications of the semiconductor device according to the first embodiment of the invention.

In the semiconductor device according to the first embodiment of the invention shown in FIG. 5, the electrode protective film 10 covers side surfaces of the oxide film 8, the tungsten silicide film 7 and the polycrystalline silicon film 6, and the top surface of the oxide film 8. However, as already explained, since the electrode protective film 10 is used to prevent abnormal growth of the tungsten silicide film 7 in a later oxidation process, it is sufficient to cover the side surfaces of the tungsten silicide film 7. On the other hand, as explained before, in order to prevent deterioration of the tunneling oxide film 3 by moisture contained in the oxide film as the electrode protective film 10, the electrode protective film 10 is required to be apart from the tunneling oxide film 3 and lie only over the gates.

Taking it into consideration, in the first and second modifications of the semiconductor device according to the first embodiment of the invention, which are shown in FIGS. 7 and 8, the electrode protective film 10 is formed to meet those requirements, namely, to cover side surfaces of the tungsten silicide film 7 and to be apart from the tunneling oxide film 3.

In the first modification shown in FIG. 7, the electrode protective film 10 covers not only side surfaces of the oxide film 8, the tungsten silicide film 7, the polycrystalline silicon film 6 and the top surface of the oxide film 8, but also covers side surfaces of the second gate insulating film and upper halves of side surfaces of the polycrystalline silicon film 4. However, it is apart from the tunneling oxide film 3.

In the second modification shown in FIG. 8, the electrode protective film 10 covers side surfaces of the oxide film 8 and the tungsten silicide film 7, but regarding side surfaces of the polycrystalline silicon film 6, the electrode protective film 10 covers only upper halves thereof instead of all.

Since the electrode protective film 10 satisfies the requirements of covering side surfaces of the tungsten silicide film 7 and being apart from the tunneling oxide film 3 in any of the first and second modifications, the same effects as those of the semiconductor device according to the first embodiment of the invention can be obtained.

Figure 9:
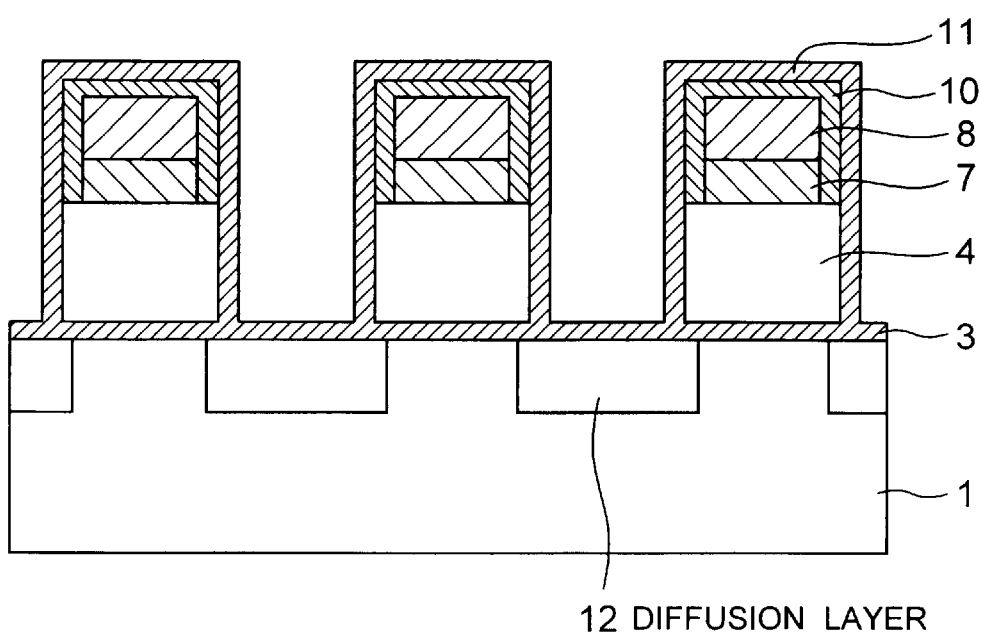
FIG. 9 is a cross-sectional view that shows configuration of a semiconductor device according to the second embodiment of the invention.

FIG. 9 is a cross-sectional view that shows configuration of a semiconductor device according to the second embodiment of the invention, and it is taken along a portion corresponding to the B–B' line of FIG. 1. Here again, the semiconductor device is a cell array of a NAND flash memory.

The semiconductor device according to the second embodiment of the invention shown in FIG. 9 is composed of a silicon substrate 1; a gate insulating film 3 in form of an oxy-nitride film stacked on the top surface of the silicon substrate 1; gate electrodes made up of a polycrystalline silicon film 4 and a tungsten silicide film 7 sequentially stacked on predetermined regions of the gate insulating film 3; an oxide film 8 stacked on the tungsten silicide film 7; a electrode protective film 10 which is a silicon oxide film stacked on side surfaces of the oxide film 8 and the tungsten silicide film 7 and on the top surface of the oxide film 8; a secondary oxide film 11 which is a silicon oxide film stacked on side surfaces of the electrode protective film 10 and the polycrystalline silicon film 4 and on top surfaces of the electrode protective film 10 and the gate insulating film 3; and diffusion layers 12 formed in predetermined region of the top surface portion of the silicon substrate 1.

The semiconductor device according to the second embodiment of the invention shown in FIG. 9 is made by the following manufacturing method according to the second embodiment of the invention.

FIGS. 10A through 10I are cross-sectional views of the semiconductor device according to the second embodiment of the invention under a process of its manufacturing method.

Figure 10A:
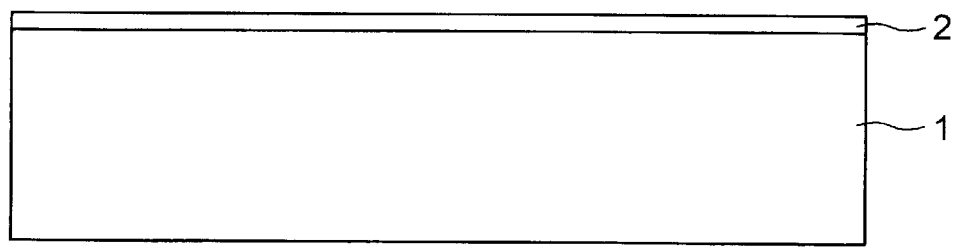
FIGS. 10A through 10I are cross-sectional views that show configuration of the semiconductor device according to the second embodiment of the invention under a process of its manufacturing method.

First as shown in FIG. 10A, the silicon oxide film 2, 7 nm thick, is made on the silicon substrate 1 by thermal oxidation.

Figure 10B:
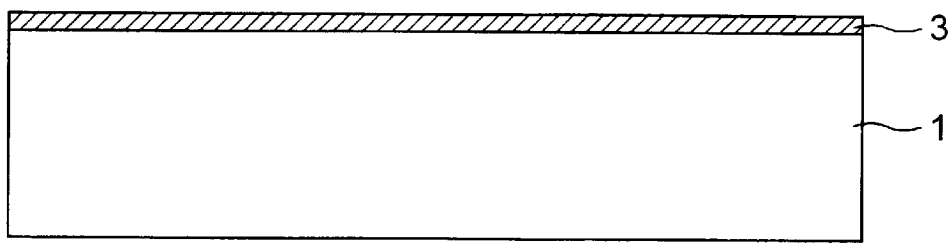

After the silicon oxide film 2 is formed, as shown in FIG. 10B, the silicon oxide film 2 is nitrified by using ammonium gas (NH$_3$) and next oxidized to form an oxy-nitride film 3. This oxy-nitride film 3 serves as a gate oxide film, and it is normally called a tunneling oxide film.

Figure 10C:
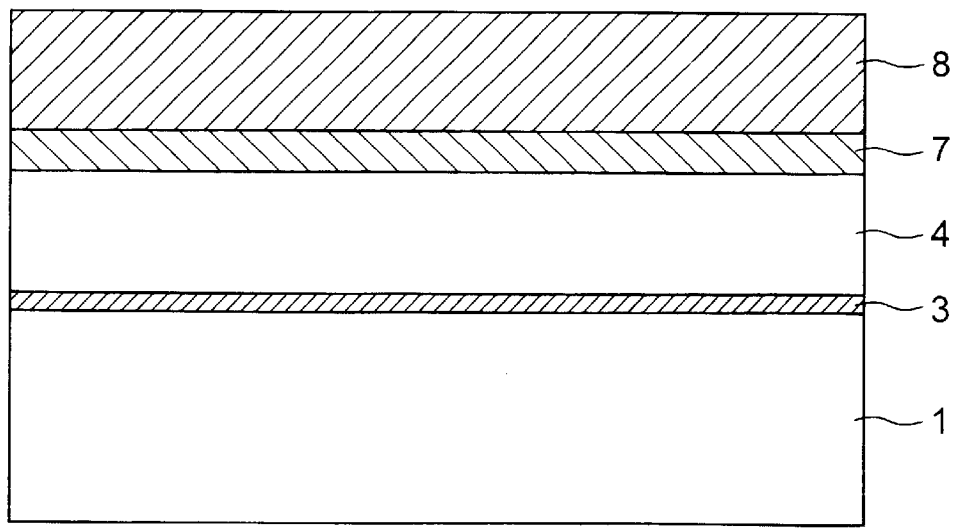

After the oxy-nitride film 3 is made, as shown in FIG. 10C, the polycrystalline silicon film 4, 200 nm thick and doped with phosphorus as an impurity, is formed on the oxy-nitride film 3 by LPCVD. The polycrystalline silicon film 4 is later processed to a part of the gate electrode. After the polycrystalline silicon film 4 is formed, the tungsten silicide film 7 of a low resistance wiring material is stacked on the polycrystalline silicon film 4 by CVD. The polycrystalline silicon film 4 and the tungsten silicide film 7, altogether, form the gate electrode. After the tungsten silicide film 7 is formed, the oxide film 8 is made on the tungsten silicide film 7 by LPCVD.

Figure 10D:
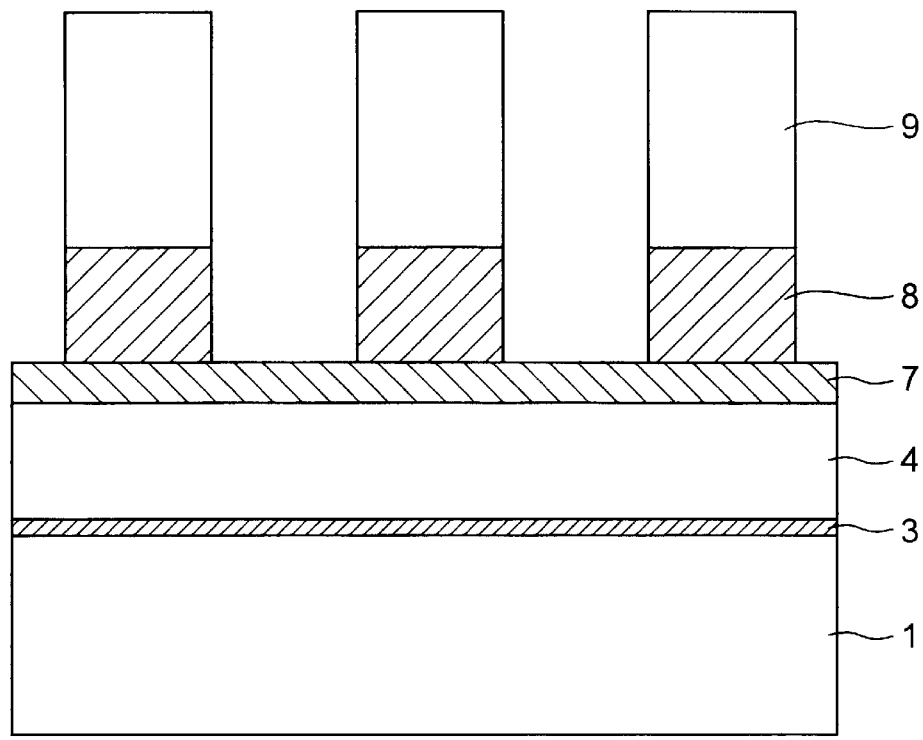

After the oxide film 8 is made, as shown in FIG. 10D, a photo resist 9 is spread on the oxide film 8 and processed into a predetermined pattern by photo-etching. Then, using the photo resist 9 as a mask, the oxide film 8 is processed into the same pattern by RIE or other dry etching. After the oxide film 8 is formed, the photo resist 9 is removed.

Figure 10E:
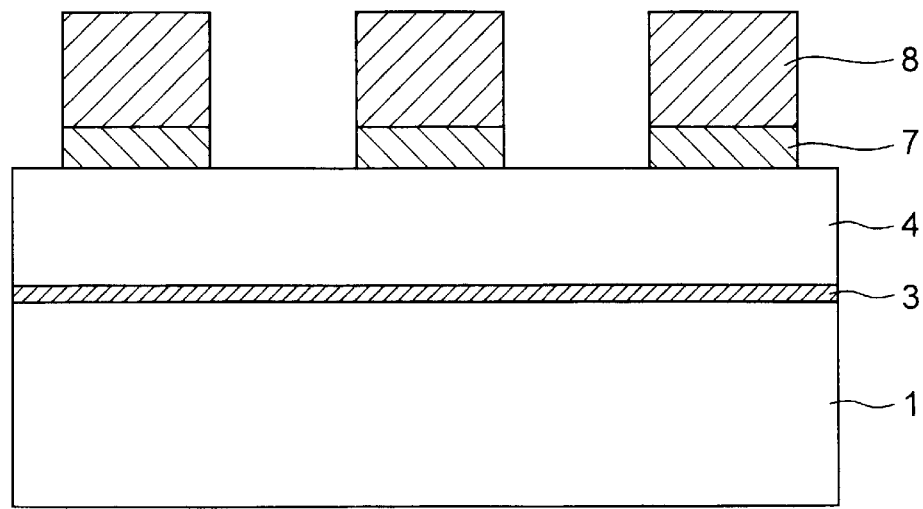

After removal of the photo resist 9, as shown in FIG. 10E, using the oxide film 8 as a mask, the tungsten silicide film 7 is selectively removed in the vertical direction by anisotropic etching using RIE or other dry etching technique.

Figure 10F:
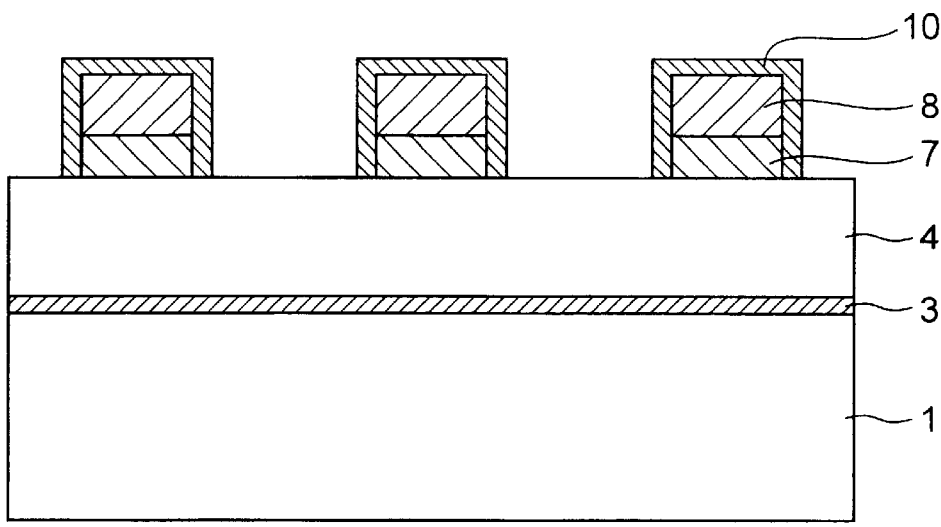

Then, in the semiconductor device and its manufacturing method according to the second embodiment of the invention, after the tungsten silicide film 7 is processed by etching, an oxide film is made as the electrode protective film 10 on side surfaces of the oxide film 8 and the tungsten silicide film 7 and on the top surface of the oxide film 8 by LPCVD as shown in FIG. 10F. Since this electrode protective film 10 is used to prevent abnormal growth of the tungsten silicide film 7 in a later oxidation process, it is sufficient for it to cover side surfaces of the tungsten silicide film 7.

Figure 10G:
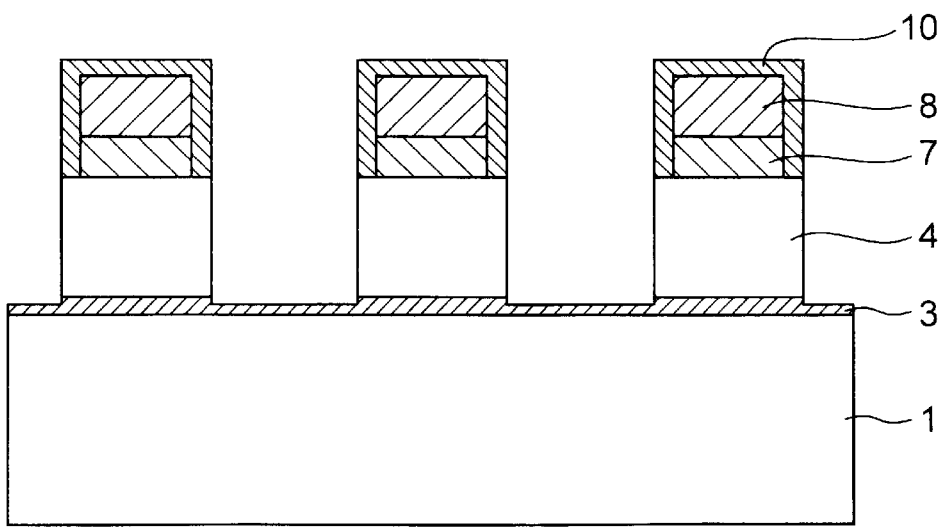

After the electrode protective film 10 is formed, as shown in FIG. 10G, using the electrode protective film 10 as a mask, the polycrystalline silicon film 4 is selectively removed by anisotropic etching in the vertical direction. As explained above, since the electrode protective film 10 may be formed to cover only side surfaces of the tungsten silicide film 7, a part of the electrode protective film 10 formed on the top surface of the oxide film 8 may be thinned or lost in this etching process.

Figure 10H:
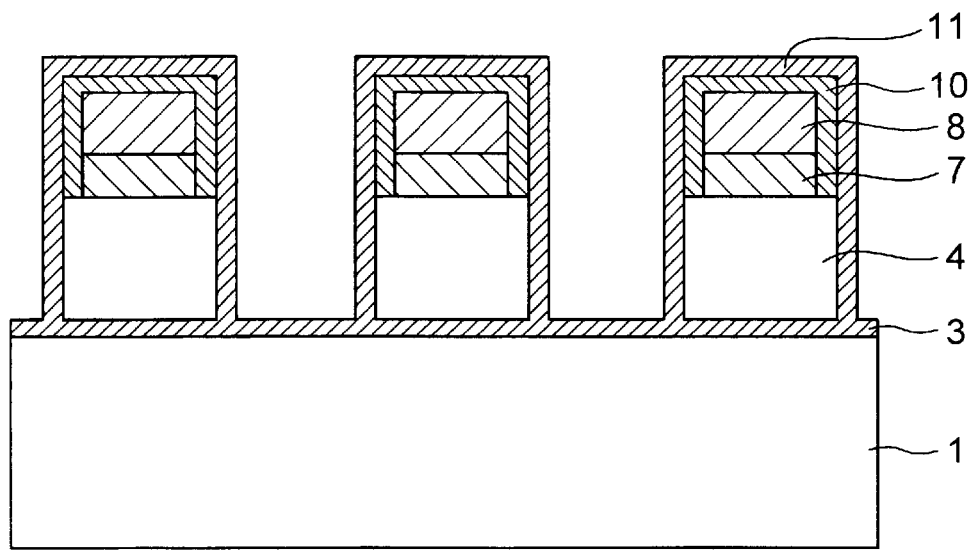

After the polycrystalline silicon film 4 is processed by etching, for the purpose of preventing leak current from the gate end, improving the surface resistance to voltage of the peripheral MOS transistor, i.e., resistance to voltage of the gate insulating film and recovering damages introduced into the gate oxide film through the gate electrode by RIE, and for other purposes, the silicon oxide film 11 is stacked on side surfaces of the electrode protective film 10 and the polycrystalline silicon film 4 and on the top surface of the electrode protective film 10 by thermal oxidation as shown in FIG. 10H. Normally, this oxidation process is called secondary oxidation process, and the oxide film 11 made in this step is called secondary oxide film. Also in the semiconductor device and its manufacturing method according to the second embodiment of the invention, similarly to the first embodiment, since the electrode protective film 10 for preventing abnormal growth of the tungsten silicide film 7 is formed, this secondary oxidation is conducted by wet oxidation to ensure that the gate insulting film (oxy-nitride film)

3, which is a thermal nitride film, is sufficiently oxidized to form the oxide film 11.

Figure 10I:
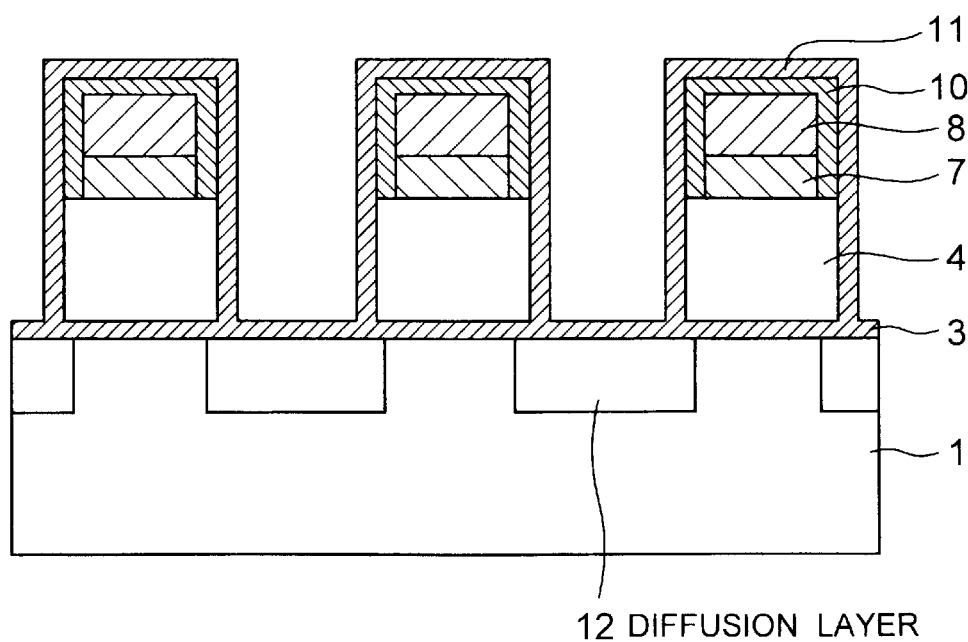

After the secondary oxide film 11 is made, as shown in FIG. 10I, for the purpose of making source regions and drain regions, an impurity is ion-implanted into the silicon substrate 1 and activated by annealing to create diffusion layers 12 and make memory transistors. As a result, the structure of the cell array of the NAND flash memory according to the second embodiment of the invention shown in FIG. 9 is obtained.

Also in the semiconductor device and its manufacturing method according to the second embodiment of the invention like the first embodiment, since the oxide film as the electrode protective film 10 covering side surfaces of the tungsten silicide film 7 forming a part of the gate electrodes is made prior to deposition of the secondary oxide film 11, it is possible to make the secondary oxide film 11 to sufficiently recover the damage of the tunneling oxide film 3 caused by gate processing while preventing abnormal oxidation of the tungsten silicide film 7. At the same time, it is also possible to round gate edges along the circumferential portions of bottoms of the gate electrodes and thereby prevent concentration of the electric field. Therefore, device property, reliability and production yield can be improved. Additionally, since the oxide film as the electrode protective film 10 covering side surfaces of the tungsten silicide film is formed to be apart from the tunneling oxide film 3 and lie only over the gates, deterioration of the tunneling oxide film 3 by moisture contained in the electrode protective film 10 does not occur, and the current flowing in the tunneling oxide film 3 can be stabilized.

Although this embodiment uses an oxide film made by CVD as the electrode protective film 10, this film may be a nitride film, polycrystalline film, or the like, instead of the oxide film. Further, this embodiment has been explained as using the tungsten silicide film to form a part of the gate electrodes. However, configuration of the invention is not limited to that, but it is widely applicable to any high-melting point metal films or high-melting point silicide films such as titanium silicide film, for example. Furthermore, although the foregoing embodiment has been explained as making the oxide film as the electrode protective film 10 covering side surfaces of the tungsten silicide film 7 by LPCVD just after etching the tungsten silicide film 7, the process need not follow this sequence, but the order of making the oxide film by LPCVD as the electrode protective film 10 may be determined optionally as far as the tungsten silicide film 7 is already etched and the top surface of the tunneling oxide film 3 is not exposed. Moreover, although this embodiment uses wet oxidation to make the oxide film 11, ozone oxidation, for example, may be used instead. Further, the oxide film 8 formed on the gate electrodes may be a nitride film, for example, provided it can functions as a mask during RIE.

Figure 11:
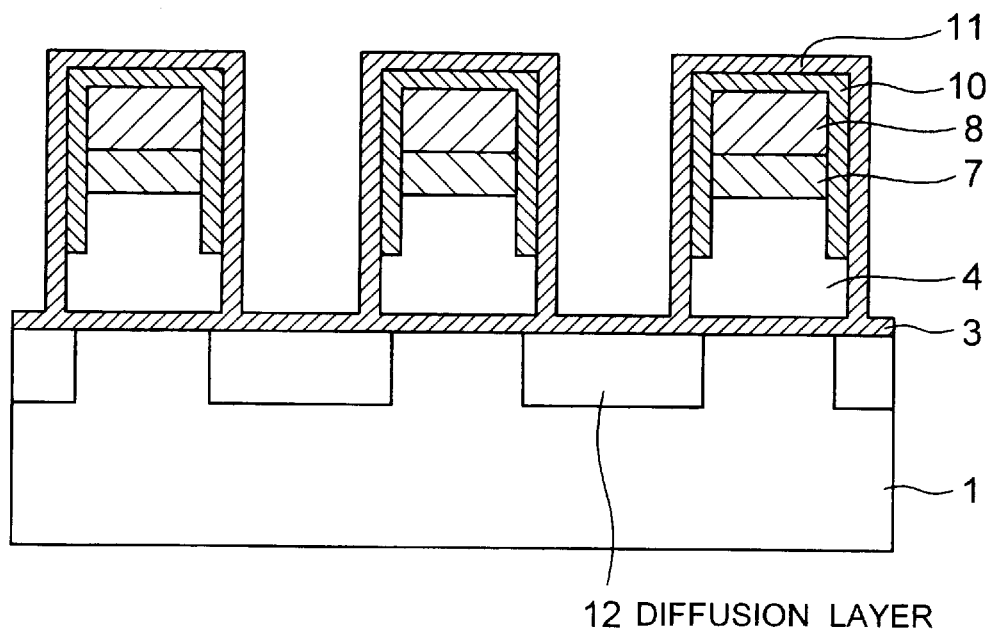
FIG. 11 is a cross-sectional view that shows configuration of a modification of the semiconductor device according to the second embodiment of the invention.

FIG. 11 is a cross-sectional view that shows a modification of the semiconductor device according to the second embodiment of the invention.

In the semiconductor device according to the second embodiment of the invention shown in FIG. 9, the electrode protective film 10 covers side surfaces of the oxide film 8 and the tungsten silicide film 7, and the top surface of the oxide film 8. However, as already explained, since the electrode protective film 10 is used to prevent abnormal growth of the tungsten silicide film 7 in a later oxidation process, it is sufficient to cover the side surfaces of the tungsten silicide film 7. On the other hand, as explained before, in order to prevent deterioration of the tunneling oxide film 3 by moisture contained in the oxide film as the electrode protective film 10, the electrode protective film 10 is required to be apart from the tunneling oxide film 3 and lie only over the gates.

Taking it into consideration, in this modification of the semiconductor device according to the second embodiment of the invention, which is shown in FIG. 11, the electrode protective film 10 is formed to meet those requirements, namely, to cover side surfaces of the tungsten silicide film 7 and to be apart from the tunneling oxide film 3.

In the modification shown in FIG. 11, the electrode protective film 10 also covers upper halves of side surfaces of the polycrystalline silicon film 4 in addition to side surface of the oxide film 8 and the tungsten silicide film 7 and the top surface of the oxide film 8. However, it is apart from the tunneling oxide film 3.

Since the electrode protective film 10 in the above modification satisfies the requirements of covering side surfaces of the tungsten silicide film 7 and being apart from the tunneling oxide film 3, the same effects as those of the semiconductor device according to the second embodiment of the invention can be obtained.

What is claimed is:

1. A semiconductor device comprising:
    a semiconductor substrate;
    a gate insulating film in form of an oxy-nitride film formed on a surface of said semiconductor substrate;
    a gate electrode including a polycrystalline silicon film directly formed on a predetermined region of said gate insulating film and a silicide film having a high melting point or a metal film having a high melting point formed on said polycrystalline silicon film;
    an electrode protective film formed to cover side surfaces of said silicide or metal film and a part of said polycrystalline silicon film, a lower end of said electrode protective film being disposed apart from said gate insulating film; and
    an oxide film formed on surfaces of said gate insulating film, said gate electrode, and said electrode protective film.

2. The semiconductor device according to claim 1, wherein said electrode protective film is an oxide film.

3. The semiconductor device according to claim 1, wherein said electrode protective film is a nitride film.

4. The semiconductor device according to claim 1, wherein said electrode protective film is a polycrystalline silicon film.

5. The semiconductor device according to claim 1, wherein said semiconductor device is a MOS transistor.

6. A semiconductor device comprising:
    a semiconductor substrate;
    a first gate insulating film in form of an oxy-nitride film formed on a surface of said semiconductor substrate;
    a first gate electrode formed on a predetermined region of said first gate insulating film;
    a second gate insulating film formed on said first gate electrode;
    a second gate electrode formed on said second gate insulating film and partly made of a silicide film having a high melting point or a metal film having a high melting point;
    an electrode protective film formed to cover side surfaces of said second gate electrode and a part of said first gate electrode, a lower end of said electrode protective film being disposed apart from said first gate insulating film; and an oxide film formed on surfaces of said first gate insulating film, said first gate electrode, said second gate insulating film, and said second gate electrode.

7. The semiconductor device according to claim 6, wherein said electrode protective film is an oxide film.

8. The semiconductor device according to claim 6, wherein said electrode protective film is a nitride film.

9. The semiconductor device according to claim 6, wherein said electrode protective film is a polycrystalline silicon film.

10. The semiconductor device according to claim 6, wherein said semiconductor device is a NAND flash memory.

11. A semiconductor device comprising:

a semiconductor substrate;

a first gate insulating film in form of an oxy-nitride film formed on a surface of said semiconductor substrate;

a first gate electrode formed on a predetermined region of said first gate insulating film;

a second gate insulating film formed on said first gate electrode;

a second gate electrode formed on said second gate insulating film and partly made of a silicide film having a high melting point or a metal film having a high melting point;

an electrode protective film formed to cover side surfaces of a part of said second gate electrode, which includes said silicide or metal film part, a lower end of said electrode protective film being disposed apart from said second gate insulating film; and an oxide film formed on surfaces of said first gate insulating film, said first gate electrode, said second gate insulating film, and said second gate electrode.

12. The semiconductor device according to claim 10, wherein said electrode protective film is an oxide film.

13. The semiconductor device according to claim 10, wherein said electrode protective film is a nitride film.

14. The semiconductor device according to claim 10, wherein said electrode protective film is a polycrystalline silicon film.

15. The semiconductor device according to claim 10, wherein said semiconductor device is a NAND flash memory.

\* \* \* \* \*